United States Patent
Yoshizumi et al.

(10) Patent No.: US 7,759,763 B2
(45) Date of Patent: Jul. 20, 2010

(54) SEMICONDUCTOR DEVICE AND A METHOD OF MANUFACTURING THE SAME

(75) Inventors: Keiichi Yoshizumi, Tokyo (JP); Kazuhisa Higuchi, Nanae (JP); Takayuki Nakaji, Nanae (JP); Masami Koketsu, Tokyo (JP); Hideki Yasuoka, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 115 days.

(21) Appl. No.: 12/116,193

(22) Filed: May 6, 2008

(65) Prior Publication Data
US 2008/0211029 A1 Sep. 4, 2008

Related U.S. Application Data

(62) Division of application No. 11/500,381, filed on Aug. 8, 2006, now Pat. No. 7,393,737.

(30) Foreign Application Priority Data
Sep. 15, 2005 (JP) .......................... 2005-268135

(51) Int. Cl.
  H01L 21/336 (2006.01)
  H01L 21/8234 (2006.01)
  H01L 21/82 (2006.01)
(52) U.S. Cl. .................. 257/510; 438/128; 438/129; 438/199; 438/202; 438/197; 257/536; 257/538; 257/E21.244; 257/E21.548
(58) Field of Classification Search .......... 257/E21.244, 257/E21.548
See application file for complete search history.

(56) References Cited

U.S. PATENT DOCUMENTS

| | | | |
|---|---|---|---|
| 4,586,238 A * | 5/1986 | Yatsuda et al. ............... 438/275 |
| 6,165,825 A | 12/2000 | Odake | |
| 6,693,315 B2 | 2/2004 | Kuroda et al. | |
| 7,045,865 B2 | 5/2006 | Amishiro et al. | |
| 7,554,202 B2 * | 6/2009 | Koubuchi et al. ............ 257/776 |
| 2002/0096728 A1* | 7/2002 | Kuhlmann ................... 257/432 |
| 2003/0008458 A1* | 1/2003 | Hashimoto et al. .......... 438/258 |
| 2003/0092233 A1* | 5/2003 | Furukawa et al. ............ 438/200 |
| 2006/0237795 A1* | 10/2006 | Kato et al. ................... 257/360 |

FOREIGN PATENT DOCUMENTS

JP 2002-158278 A 5/2002
JP 2002-261244 A 9/2002

\* cited by examiner

*Primary Examiner*—Charles D Garber
*Assistant Examiner*—Mohsen Ahmadi
(74) *Attorney, Agent, or Firm*—Miles & Stockbridge P.C.

(57) ABSTRACT

A semiconductor device which, in spite of the existence of a dummy active region, eliminates the need for a larger chip area and improves the surface flatness of the semiconductor substrate. In the process of manufacturing it, a thick gate insulating film for a high voltage MISFET is formed over an n-type buried layer as an active region and a resistance element IR of an internal circuit is formed over the gate insulating film. Since the thick gate insulating film lies between the n-type buried layer and the resistance element IR, the coupling capacitance produced between the substrate (n-type buried layer) and the resistance element IR is reduced.

9 Claims, 9 Drawing Sheets

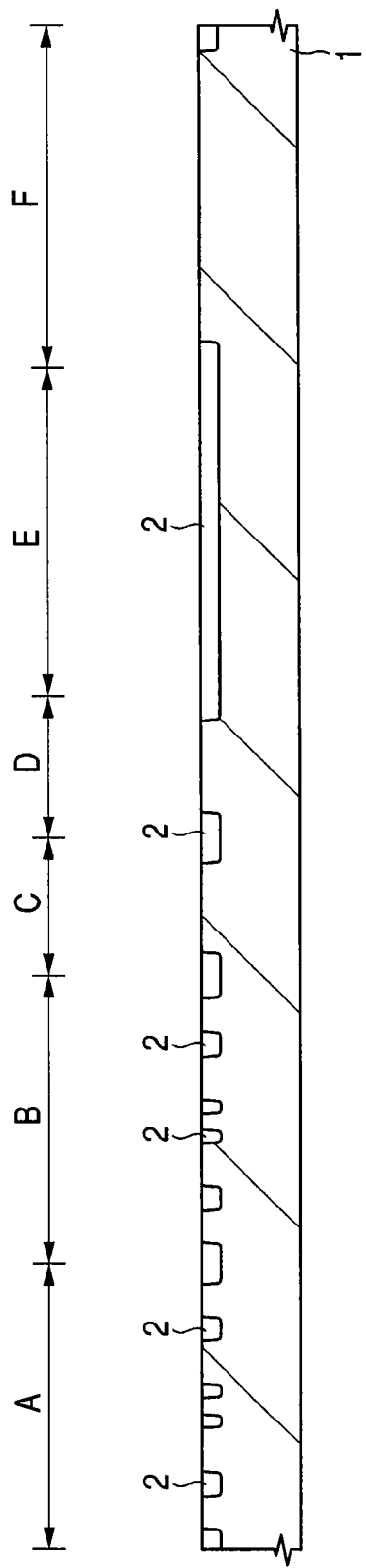
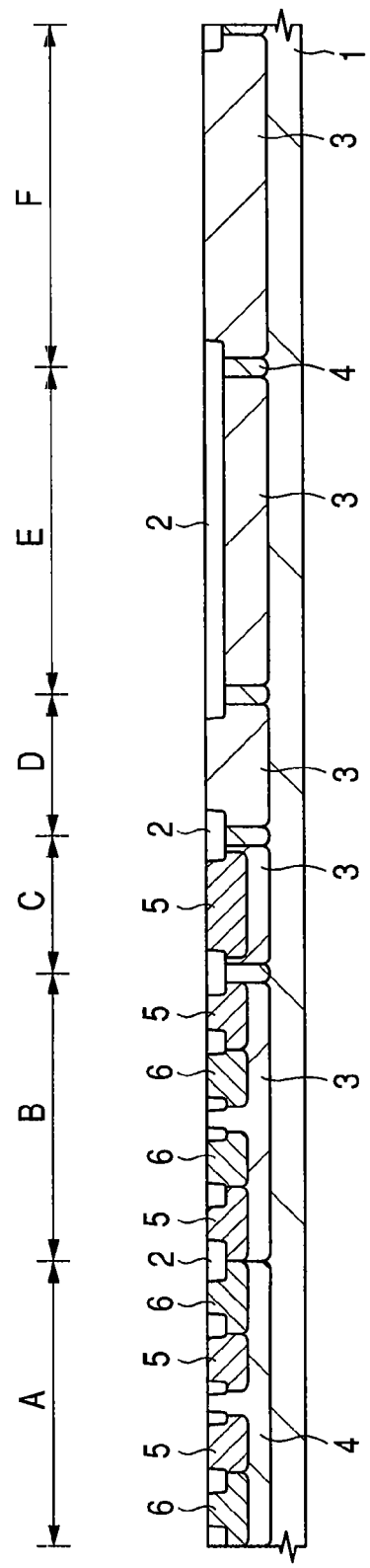

SEMICONDUCTOR DEVICE AND A METHOD OF MANUFACTURING THE SAME

CROSS-REFERENCE TO RELATED APPLICATION

This application is a division of application Ser. No. 11/500,381 filed Aug. 8, 2006 now U.S. Pat. No. 7,393,737. This application also claims priority from Japanese patent application No. 2005-268135 filed Sep. 15, 2005, the content of which is hereby incorporated by reference into this application.

BACKGROUND OF THE INVENTION

The present invention relates to a semiconductor device and a technique of manufacturing the same and more particularly to a technique which is useful for a semiconductor device having a high voltage MISFET and a resistance element over a semiconductor substrate and a technique of manufacturing the same.

As a technique of electrically isolating neighboring semiconductor elements, the STI (Shallow Trench Isolation) technique has been known where a trench is made in an element isolating region of a semiconductor substrate and an insulating film is buried in it. In order to make such an element isolating trench, first the semiconductor substrate is etched to make a trench and then a silicon oxide film whose thickness is larger than the depth of the trench is deposited on the substrate. Then, the silicon oxide film portion protruding from the trench is removed by chemical mechanical polishing, so that some of the silicon oxide film is left inside the trench and the trench surface is flattened.

The size of a semiconductor element is optimized according to its purpose or functionality and in fact, various semiconductor elements of different sizes are mounted on a semiconductor substrate. For example, it is common that a MISFET which operates at high supply voltage (hereinafter called a high voltage MISFET) is larger than a MISFET which operates at low supply voltage (hereinafter called a low voltage MISFET) and also the gate insulating film of the former is thicker than that of the latter. Furthermore, generally speaking, passive elements such as resistance elements and capacitors are larger than low voltage MISFETs. In addition, since integrated circuits vary in integration density of semiconductor elements according to the purpose or functionality, it is common that some areas of an actual semiconductor substrate are densely dotted with semiconductor elements and other areas of it are sparsely dotted with semiconductor elements.

On the other hand, the size of a semiconductor element isolating trench is determined by the semiconductor element size and density. This means that in an actual semiconductor substrate, there are element isolating trenches of different sizes and some areas are densely dotted with element isolating trenches and other areas are sparsely dotted with element isolating trenches.

However, in the conventional process of making element isolating trenches, the following problem arises: when plural trenches of different sizes are made in a semiconductor substrate and then a silicon oxide film is deposited on them and their surfaces are polished by chemical mechanical polishing, the surface of the buried silicon oxide film may become concave particularly in a large trench, like a dish (this phenomenon is called dishing).

If such dishing should occur on a silicon oxide film in an element isolating trench, when a thin film is deposited on the semiconductor substrate at a later step, the surface flatness of the thin film deteriorates in the area above the element isolating trench. For this reason, at a next step where a photoresist film is formed over the thin film and an exposure is made, the exposure light focus range may decrease in the area above the element isolating trench, resulting in a decline in resist pattern accuracy.

As a solution to this problem, the following technique has been proposed and being applied to actual semiconductor product manufacturing processes: many small dummy active regions are made in a matrix pattern in a large element isolating region where dishing might occur considerably, in order to decrease the actual area of element isolating trenches in this region and thereby prevent dishing of the silicon oxide film.

One of the conventional techniques of making dummy active regions in a large element isolating region is described in Japanese Unexamined Patent Publication No. 2002-158278. This document discloses a technique which improves the surface flatness of the silicon oxide film and reduces the amount of data for making a photo mask for dummy active region formation by making two types of dummy active regions of different sizes in an element isolating region.

Japanese Unexamined Patent Publication No. 2002-261244 points out a problem that when a resistance element made up of a polycrystal silicon film is formed over an element isolating trench, the resistance element's width, thickness and sectional shape are different between the central part and peripheral parts of the trench due to dishing of the silicon oxide film. As a solution to this problem, the document discloses a technique which arranges dummy active regions in the vicinities of regions where resistance elements are to be formed and partitions the silicon oxide film as needed to prevent dishing.

SUMMARY OF THE INVENTION

The present inventors examined these conventional techniques and found the following problems. In the case of the technique which arranges dummy active regions in element isolating regions and forms resistance elements over them, coupling capacitance might occur between a dummy active region and a resistance element, causing change in the characteristics of the resistance element.

The technique which improves the chip surface flatness by making dummy active regions in part of a semiconductor chip is effective only when the ratio of dummy active regions to the whole semiconductor chip is large enough, which would necessitate an increase in the chip area.

An object of the present invention is to provide a technique which improves the surface flatness of a semiconductor substrate while an increase in dummy active regions does not necessitate an increase in the chip area.

Another object of the invention is to provide a technique which improves the reliability of a resistance element.

A further object of the invention is to provide a technique which improves the electrostatic discharge immunity of a resistance element for an ESD protection circuit.

A further object of the invention is to provide a technique which simplifies a semiconductor device manufacturing process in which a high voltage MISFET and resistance elements are formed on a semiconductor substrate.

The above and further objects and novel features of the invention will more fully appear from the following detailed description in this specification and the accompanying drawings.

Preferred embodiments of the invention which will be disclosed herein are briefly outlined below.

According to one aspect of the present invention, a semiconductor device includes: a first MISFET which has a first gate insulating film formed in a first region of a main surface of a semiconductor substrate and operates at a first supply voltage; a second MISFET which has a second gate insulating film formed in a second region of the main surface of the semiconductor substrate and thicker than the first gate insulating film and operates at a second supply voltage higher than the first supply voltage; and a resistance element made up of a silicon film formed in a third region of the main surface of the semiconductor substrate. Here, an insulating film is formed in the third region of the main surface of the semiconductor substrate at the same level as the second gate insulating film and the resistance element is formed over the insulating film.

According to another aspect of the invention, a semiconductor device has: an internal circuit including a first MISFET which has a first gate insulating film formed in a first region of a main surface of a semiconductor substrate and operates at a first supply voltage, a second MISFET which has a second gate insulating film formed in a second region of the main surface of the semiconductor substrate and thicker than the first gate insulating film and operates at a second supply voltage higher than the first supply voltage, and a first resistance element made up of a silicon film formed in a third region of the main surface of the semiconductor substrate; and an electrostatic discharge protection circuit including a second resistance element made up of a silicon film formed in a fourth region of the main surface of the semiconductor substrate. Here, a first insulating film is formed under each of the first and second resistance elements at the same level as the second gate insulating film.

The effects brought about by preferred embodiments disclosed herein are briefly outlined below.

The ratio of dummy active regions to the overall area of the semiconductor substrate can be smaller than when dummy active regions are made in element isolating regions and resistance elements are formed over them; thus it is possible to improve the surface flatness of the semiconductor substrate and reduce the chip size at the same time.

BRIEF DESCRIPTION OF THE DRAWINGS

FIG. 2 is a sectional view of a semiconductor substrate showing a step in a semiconductor device manufacturing method according to an embodiment of the invention;

FIG. 3 is a sectional view of the semiconductor substrate showing a step next to the step of FIG. 2 in the semiconductor device manufacturing method;

DETAILED DESCRIPTION OF THE PREFERRED EMBODIMENTS

Figure 1:
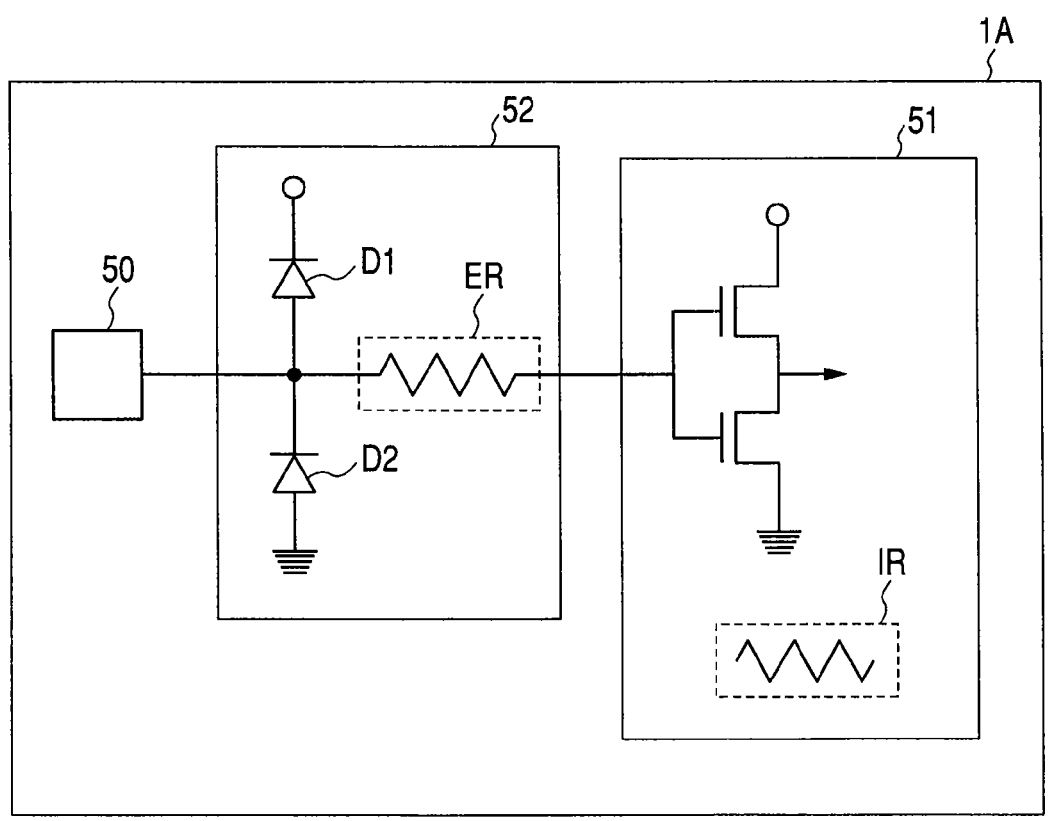
FIG. 1 is a schematic diagram showing the circuit configuration of a semiconductor device according to an embodiment of the invention.

Next, preferred embodiments of the present invention will be described in detail referring to the accompanying drawings. In all the drawings that illustrate the preferred embodiments, elements with like functions are designated by like reference numerals and repeated descriptions of such elements are omitted.

First Embodiment

FIG. 1 schematically shows the circuit configuration of an LCD driver according to the first embodiment. The LCD driver includes an input/output terminal (bonding pad) 50, an internal circuit 51, and an ESD protection circuit 52 which are formed on the main surface of a semiconductor chip 1A of monocrystal silicon.

Although not shown in FIG. 1, the internal circuit 51 includes complementary MISFETs which are operated by three different supply voltages (for example, 25V, 6V, 1.5V). A resistance element IR is formed in part of the internal circuit 51. In the explanation given below, complementary MISFETs (n-channel MISFET and p-channel MISFET) which operate at 25V supply voltage are called high voltage MISFETs, complementary MISFETs which operate at 6V supply voltage are called medium voltage MISFETs and complementary MISFETs which operate at 1.5V supply voltage are called low voltage MISFETs.

Located between the input/output terminal 50 and the internal circuit 51, the ESD protection circuit 52 prevents the internal circuit 51 from breaking down due to high voltage electrostatic charge on the input/output terminal 50. The ESD protection circuit consists of protective diodes $D_1$ and $D_2$ and a resistance element ER. 6 V is supplied to the resistance element ER of the ESD protection circuit 52 and the resistance element IR of the internal circuit 51, like medium voltage MISFETs.

Next, referring to FIGS. 2 to 11, an LCD driver manufacturing method according to this embodiment will be explained step by step. For simpler illustration of the manufacturing method, only p-channel MISFETs are shown (n-channel MISFETs are not shown) for low voltage MISFETs which operates at 1.5 V supply voltage and medium voltage MISFETs which operate at 6 V supply voltage.

As shown in FIG. 2, element isolating trenches 2 are made in a semiconductor substrate of p-type monocrystal silicon (hereinafter simply called the substrate) 1. Element isolating trenches 2 are made as follows: trenches are made in the substrate 1 by dry etching using, for example, a silicon nitride film as a mask, then a silicon oxide film is deposited on the substrate 1 by a CVD process, then the silicon oxide film portions outside the trenches are removed by chemical mechanical polishing.

In the figure, region A represents a region in which a high voltage n-channel MISFET to operate at 25 V supply voltage is to be formed; region B represents a region in which a high voltage p-channel MISFET to operate at 25 V supply voltage is to be formed; region C represents a region in which a medium voltage p-channel MISFET to operate at 6 V supply voltage is to be formed; region D represents a region in which a low voltage p-channel MISFET to operate at 1.5 V supply voltage is to be formed; region E represents a region in which the resistance element ER of the ESD protection circuit 52 is to be formed; and region F represents a region in which the resistance element IR of the internal circuit 51 is to be formed. As illustrated in the figure, in this embodiment, an element isolating trench 2 spreads all over the region E of the substrate 1 in which the resistance element ER of the ESD protection circuit 52 is to be formed. On the other hand, no element isolating trench is formed in the region F of the substrate 1 in which the resistance element IR of the internal circuit 51 is formed.

Next, as shown in FIG. 3, phosphorous ions (P) are implanted in some parts of the substrate 1 and boron ions (B) are implanted in other parts so as to form n-type buried layers 3 and p-type buried layers 4 in a deep region of the substrate 1. Also, phosphorous ions are implanted in parts of the substrate 1, namely the regions A, B where high voltage MISFETs are to be formed and the region C where medium voltage MISFETs are to be formed, and boron ions are implanted in other parts so as to make n-type wells 5 and p-type wells 6.

The n-type wells 5 made in the region A of the substrate 1 function as the source and drain for the high voltage n-channel MISFET and the p-type wells 6 made in the region B function as part of the source and drain for the high voltage p-channel MISFET.

Figure 4:
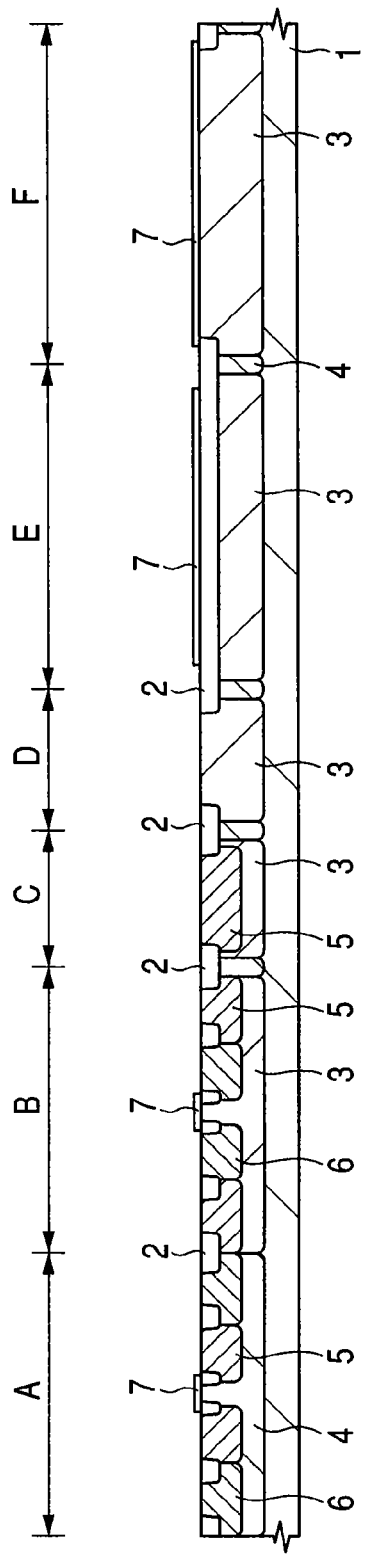
FIG. 4 is a sectional view of the semiconductor substrate showing a step next to the step of FIG. 3 in the semiconductor device manufacturing method.

As shown in FIG. 4, a gate insulating film 7 is formed on the surfaces of the regions A, B, E and F of the substrate 1. The gate insulating film 7 is formed as follows. First, after a thin silicon oxide film with a thickness of 10 nm or less is made over the surface of the substrate 1 by thermal oxidation of the substrate 1, a silicon oxide film is deposited on the silicon oxide film by a CVD process. The sum of the thickness of the silicon oxide film made by thermal oxidation and the thickness of the silicon oxide film deposited by the CVD process should be 60 nm or more. Next, these silicon oxide films are patterned using a photoresist film as a mask to leave the film 7 in the regions A, B, E, and F on the surface of the substrate 1. Almost all the surface of the substrate 1 in the regions E and F should be covered by the gate insulating film 7.

Figure 5:
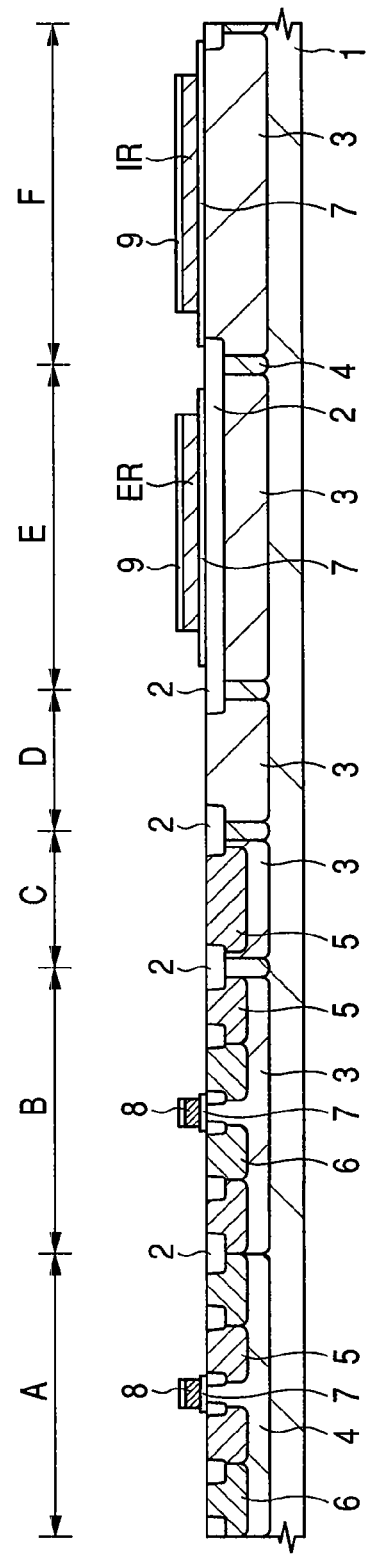
FIG. 5 is a sectional view of the semiconductor substrate showing a step next to the step of FIG. 4 in the semiconductor device manufacturing method.

Next, as shown in FIG. 5, a gate electrode 8 for the high voltage n-channel MISFET is formed on the gate insulating film 7 in the region A, and a gate electrode 8 for the high voltage p-channel MISFET is formed on the gate insulating film 7 in the region B. The gate electrodes 8 are formed as follows. After an n-type polycrystal silicon film is formed over the substrate 1 by a CVD process, a cap insulating film 9 is formed over the n-type polycrystal silicon film. The cap insulating film 9 consists of, for example, a laminate of a silicon oxide film and a silicon nitride film. Then, the cap insulating film 9 and the n-type polycrystal silicon film are patterned by dry etching using a photoresist film as a mask.

In this embodiment, the cap insulating film 9 and the n-type polycrystal silicon film are left over the gate insulating film 7 in the region E to form a resistance element ER made up of an n-type polycristal silicon film covered by the cap insulating film 9. Also, the cap insulating film 9 and the n-type polycrystal silicon film are left over the gate insulating film 7 in the region F to form a resistance element IR made up of an n-type polycrystal silicon film covered by the cap insulating film 9.

Figure 6:
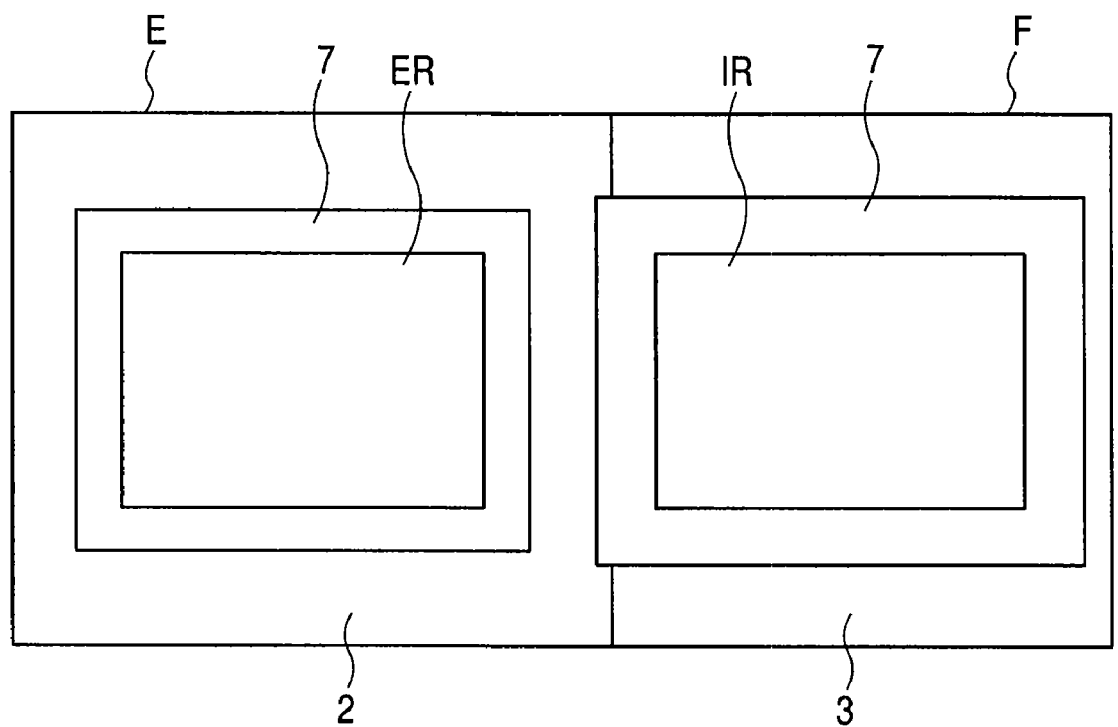
FIG. 6 is a plan view of the semiconductor substrate showing the step next to the step of FIG. 4 in the semiconductor device manufacturing method.

FIG. 6 is a plan view showing the resistance element ER formed in the region E and the resistance element IR formed in the region F. As illustrated in FIGS. 5 and 6, the resistance element IR of the internal circuit 51 lies over the n-type buried layer 3 as an active region. However, in this embodiment, since a thick insulating film with a thickness of 60 nm or more (gate insulating film 7) lies between the n-type buried layer 3 and the resistance element IR, the coupling capacitance between the substrate 1 (n-type buried layer 3) and the resistance element IR is reduced.

In other words, according to this embodiment, the resistance element IR can be formed over an active region (n-type buried layer 3) without making almost any consideration of the capacitance with the substrate 1. This means that the ratio of dummy active regions to the overall area of the substrate 1 can be smaller than when a dummy active region is made in an element isolating trench 2 with a silicon oxide film buried therein and a resistance element IR is formed over it. Consequently, it is possible to improve the surface flatness of the substrate 1 and reduce the chip size at the same time.

In this embodiment, an insulating film to lie between the n-type buried insulating film 3 and the resistance element IR, and the gate insulating film 7 for the high voltage MISFET are formed simultaneously, which eliminates the need for a special process to form an insulating film.

On the other hand, if the resistance element ER of the ESD protection circuit 52 lies over an active region, there would be a problem that the ESD immunity easily deteriorates at the edges of the polycrystal silicon film making up the resistance element ER when high voltage static electricity is applied. In other words, due to external static voltage, usually the voltage applied to the resistance element ER would be higher than the voltage applied to the resistance element IR and thus its ESD immunity would deteriorate easily. However, in this embodiment, the resistance element ER lies over the element isolating trench 2, which prevents deterioration in ESD immunity and assures the reliability of the ESD protection circuit 52. Specifically, the insulating film under the resistance element ER is thicker than the insulating film under the resistance element IR so that the ESD immunity of the resistance element ER is higher than that of the resistance element IR. Furthermore, in this embodiment, the thick insulating film (gate insulating film 7) with a thickness of 60 nm or more lies between the element isolating trench 2 and the resistance element ER, which prevents deterioration in ESD immunity more reliably.

Figure 7:
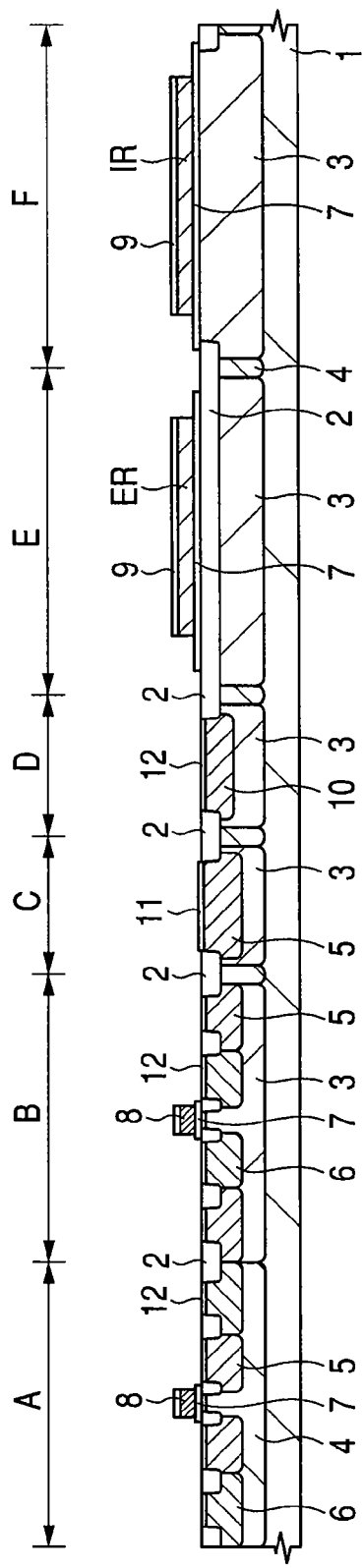
FIG. 7 is a sectional view of the semiconductor substrate showing a step next to the step of FIG. 5 in the semiconductor device manufacturing method.

Next, as shown in FIG. 7, phosphorous ions are implanted in the n-type buried layer 3 of the region D for formation of a low voltage p-channel MISFET to form an n-type semiconductor region 10. Then, a gate insulating film 11 as a 12 nm thick silicon oxide film is formed in the region C for formation of a medium voltage p-channel MISFET and a gate insulating film 12 as a 3 nm thick silicon oxide film is formed in the region D for formation of a low voltage p-channel MISFET.

The gate insulating films of different thicknesses 11 and 12 are formed as follows. First, a silicon oxide film with a thickness of 9 nm or so is formed on the surface of the substrate 1 in the regions A, B, C, and D by thermal oxidation of the substrate 1. Then the surface of the substrate 1 in the region C is covered by a photoresist film and the silicon oxide film formed on the surface of the substrate 1 in the other regions (A, B, and D) is removed by wet etching. After removal of the photoresist film, a gate insulating film 12 as a 3 nm thick silicon oxide film is formed on the surface of the substrate 1 in the regions A, B, and D by thermal oxidation of the substrate 1 again. In this process, the silicon oxide film with a thickness of 9 nm or so left on the surface of the substrate 1 in the region C grows into a 12 nm thick gate insulating film 11.

Figure 8:
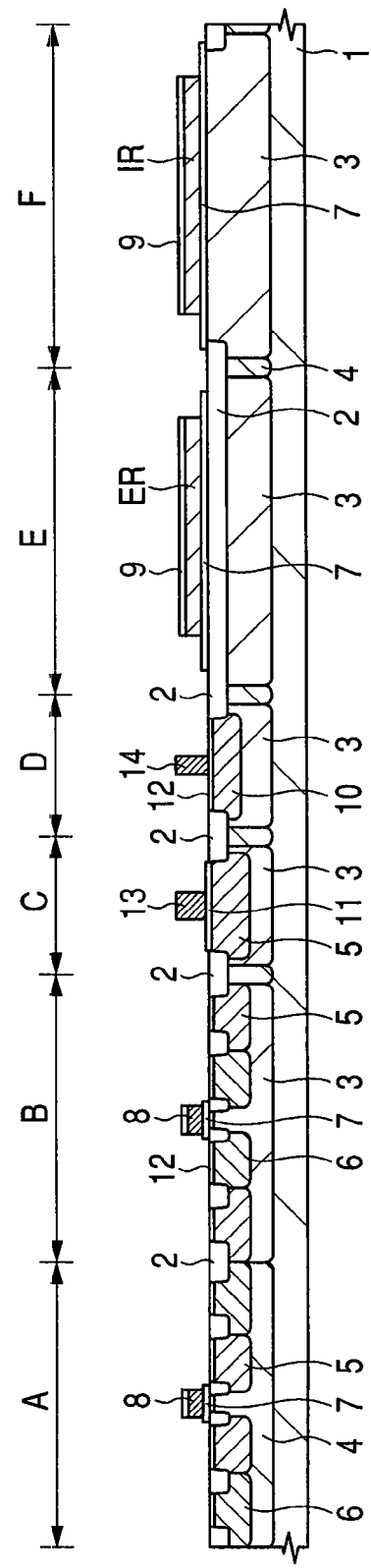
FIG. 8 is a sectional view of the semiconductor substrate showing a step next to the step of FIG. 7 in the semiconductor device manufacturing method.

Next, as shown in FIG. 8, a gate electrode 13 for a medium voltage p-channel MISFET is formed in the region C and a gate electrode 14 for a low voltage p-channel MISFET is formed in the region D. The gate electrodes 13 and 14 are formed as follows. After an n-type polycrystal silicon film is formed over the substrate 1 by a CVD process, the n-type polycrystal silicon film is patterned by dry etching using a photoresist film as a mask.

Figure 9:
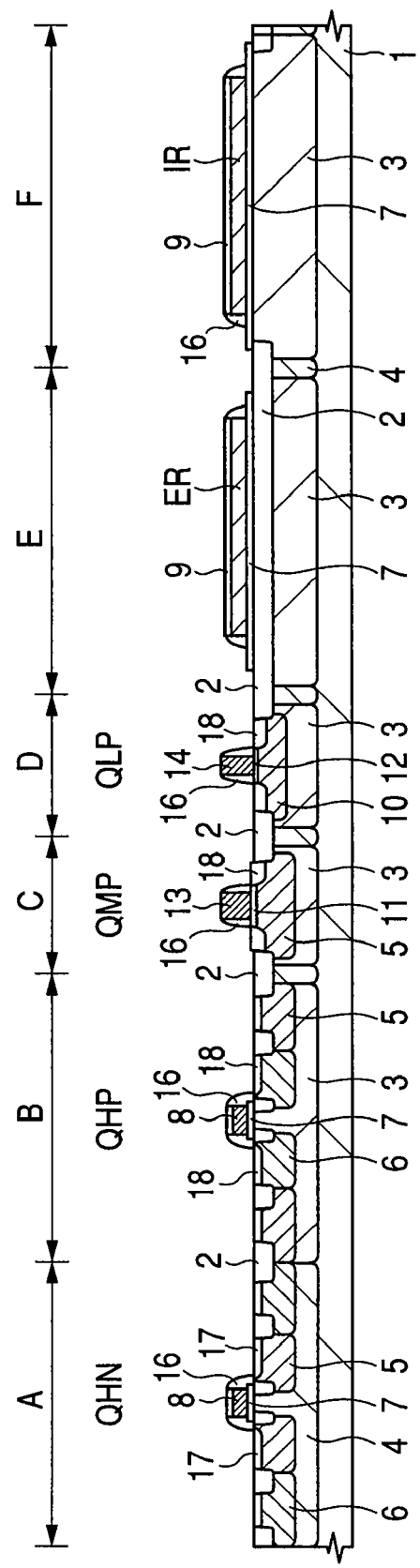
FIG. 9 is a sectional view of the semiconductor substrate showing a step next to the step of FIG. 8 in the semiconductor device manufacturing method.

Next, as shown in FIG. 9, sidewall spacers 16 are made on the sidewalls of the gate electrodes 8, 13, and 14. The sidewall spacers 16 are made by anisotropic etching of the silicon oxide film deposited on the substrate 1 by a CVD process. Then, an n-type semiconductor region 17 is formed on the surface of the n-type well 5 in the region A by implanting phosphorous ions into some part of the substrate 1 and boron ions into other parts. Also, p-type semiconductor regions 18 are formed on the surfaces of the p-type well 6 in the region B and the n-type well 5 in the region C and the n-type semiconductor region 10 in the region D. The n-type semiconductor regions 17 made on the n-type well 5 in the region A function as the source and drain for the high voltage n-channel MISFET and the p-type semiconductor regions 18 made on the p-type well 6 in the region B function as the source and drain for the high voltage p-channel MISFET. Also the p-type semiconductor regions 18 made on the n-type well 5 in the region C function as the source and drain for the medium voltage p-channel MISFET and the p-type semiconductor regions 18 made on the n-type semiconductor region 10 in the region D function as the source and drain for the low voltage p-channel MISFET.

As a consequence of the above steps, a high voltage n-channel MISFET ($Q_{HN}$) is formed over the substrate 1 in the region A and a high voltage p-channel MISFET ($Q_{HP}$) is formed over the substrate 1 in the region B. Also a medium voltage p-channel MISFET ($Q_{MN}$) is formed over the substrate 1 in the region C and a low voltage p-channel MISFET ($Q_{LP}$) is formed over the substrate 1 in the region D.

Figure 10:
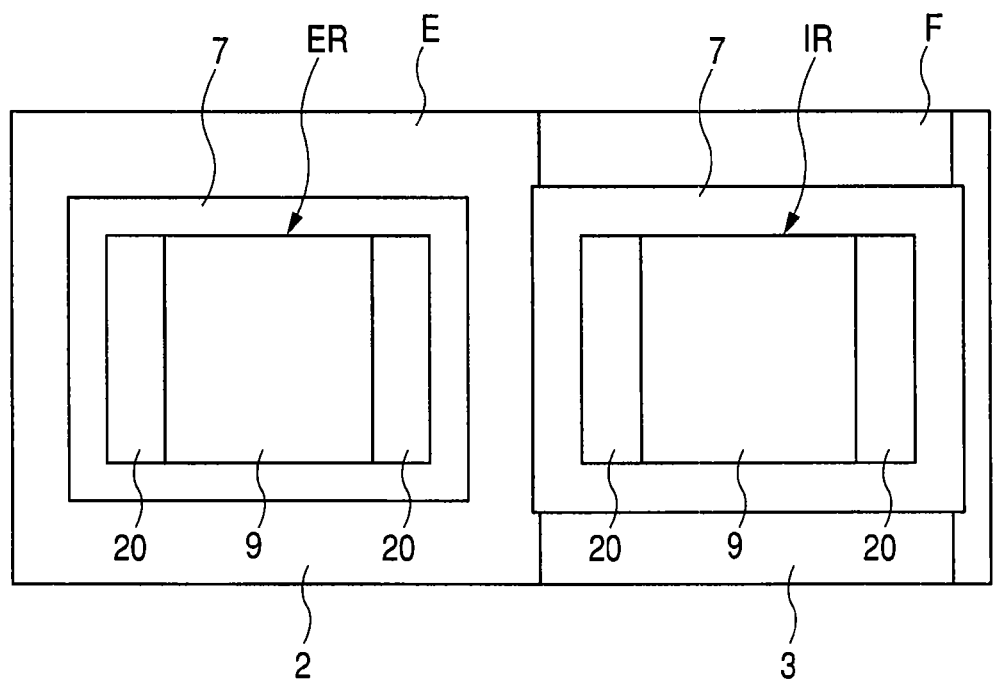
FIG. 10 is a plan view showing a resistance element formed in an internal circuit and a resistance element formed in an ESD protection circuit.
Figure 11:
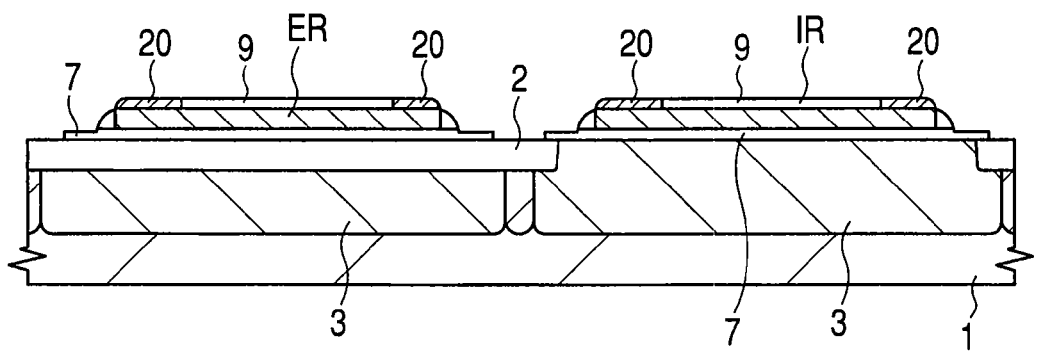
FIG. 11 is a sectional view showing a resistance element formed in an internal circuit and a resistance element formed in an ESD protection circuit as another example.

Next, as shown in FIGS. 10 and 11, after the cap insulating film 9 which covers both ends of the polycrystal silicon films making up the resistance elements ER and IR, namely the wire connections, is removed by etching, silicide layers 20 are formed on the surfaces of the exposed resistance elements ER and IR in order to decrease electric resistance. The purpose of forming silicide layers on the resistance elements ER and IR separately in this way is to control each resistance element to attain a desired resistance level. More specifically, the resistance level of each resistance element is controlled by controlling the area of the silicide layers 20 (which has a relatively low resistance) and the area of the polycrystal silicon film (which has a relatively high resistance).

Though not shown, silicide layers 20 are formed on the surfaces of the respective sources and drains of the high voltage n-channel MISFET ($Q_{HN}$), high voltage p-channel MISFET ($Q_{HP}$), medium voltage p-channel MISFET ($Q_{MN}$), and low voltage p-channel MISFET ($Q_{LP}$). Then, plural wiring layers are formed over the substrate 1 with an interlayer insulating film between wiring layers though not shown. These silicide layers 20 may be cobalt silicide layers ($CoSi_2$), titanium silicide layers ($TiSi_2$) or nickel silicide layers ($NiSi_2$) or the like.

According to this embodiment, since the resistance element IR can lie over an active region (n-type buried layer 3), the ratio of dummy active regions to the overall area of the substrate 1 can be decreased. Therefore it is possible to improve the surface flatness of the substrate 1 and reduce the chip side at the same time.

Since the insulating film which should lie between the active region and the resistance element IR can be formed concurrently during the process of forming the gate insulating film 7 for the high voltage MISFET, the abovementioned effect can be achieved without any additional manufacturing step.

Second Embodiment

Figure 12:
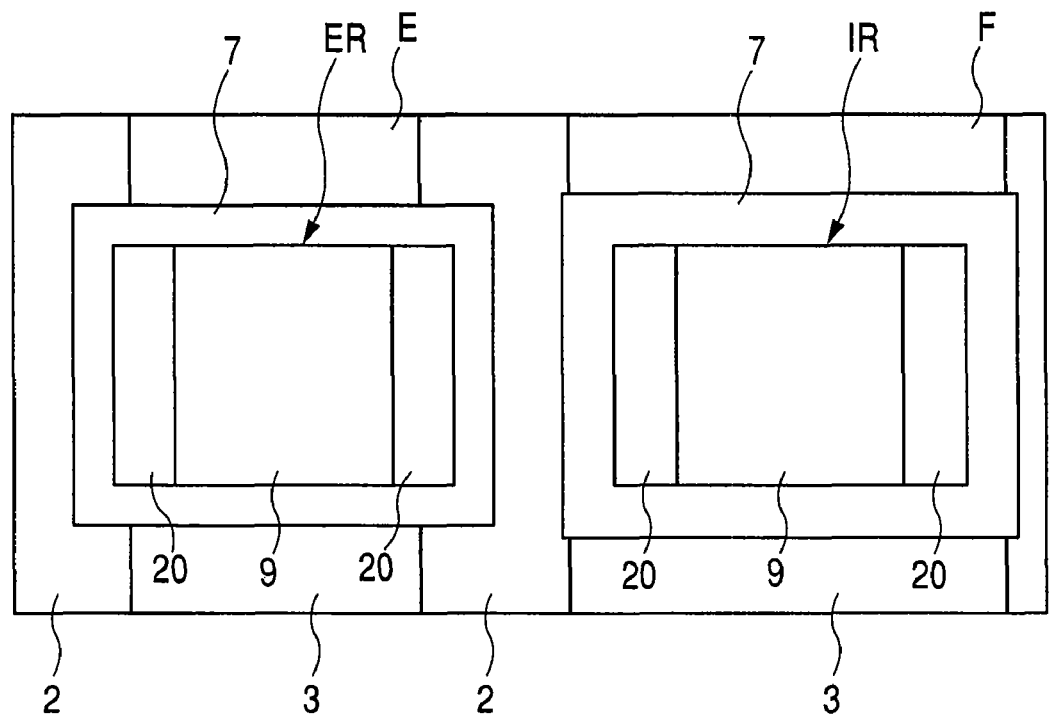
FIG. 12 is a plan view showing a resistance element formed in an internal circuit and a resistance element formed in an ESD protection circuit as another example.
Figure 13:
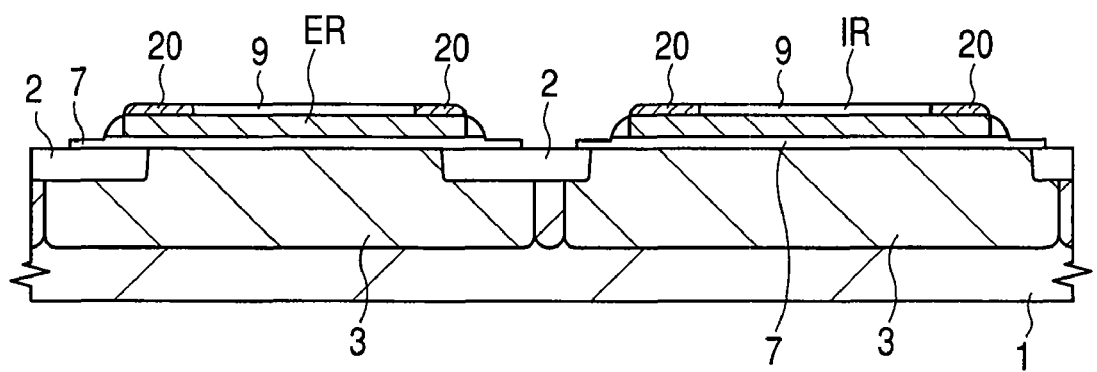
FIG. 13 is a sectional view showing a resistance element formed in an internal circuit and a resistance element formed in an ESD protection circuit as another example.

While in the first embodiment the resistance element ER of the ESD protection circuit 52 lies over the element isolating trench 2, in the second embodiment the resistance element ER lies over an active region (n-type buried layer 3) as shown in FIGS. 12 and 13. On the other hand, the resistance element IR of the internal circuit 51 lies over an active region (n-type buried layer 3) as in the first embodiment.

However, as mentioned above, when the resistance element ER lies over the active region, the ESD immunity would easily deteriorate at the edges of the polycrystal silicon film making up the resistance element ER. Therefore, in this embodiment, in order to prevent deterioration in ESD immunity, the resistance element is formed in a way that its central part lies over the active region and its edges lie over element isolating trenches 2. Furthermore, an insulating film (gate insulating film 7) with a thickness of 60 nm or more is formed between the element isolating trenches 2 and the resistance element ER so that deterioration in ESD immunity is prevented more reliably. In addition, this contributes to reduction in coupling capacitance between the resistance element ER and the substrate 1.

According to this embodiment, two different types of resistance elements ER and IR can be formed over active regions without deteriorating the ESD immunity of the resistance element ER and without making almost any consideration of the capacitance with the substrate 1. This means that the ratio of element isolating regions to the overall area of the substrate 1 can be smaller than when resistance elements ER and IR are formed over element isolating trenches 2 in which a silicon oxide film is buried. Consequently, it is possible to improve the surface flatness of the substrate 1 and reduce the chip size at the same time.

Third Embodiment

Figure 14:
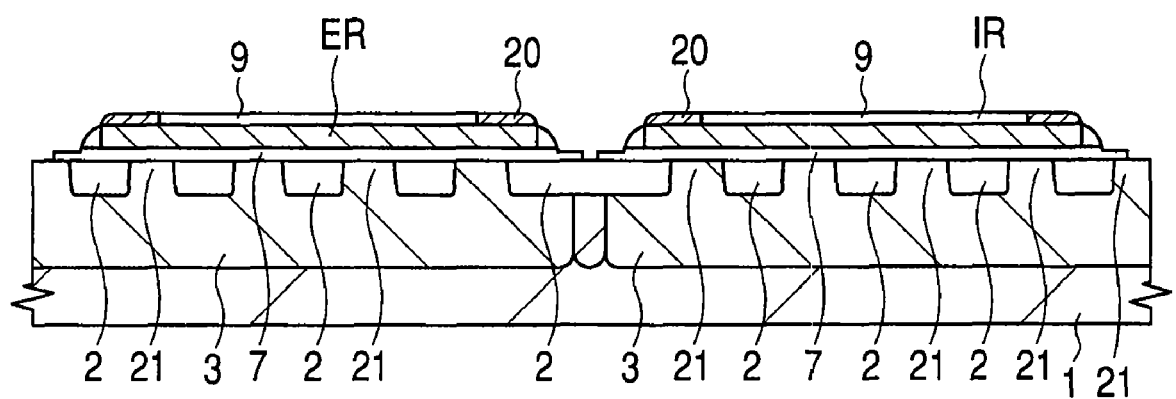
FIG. 14 is a sectional view showing a resistance element formed in an internal circuit and a resistance element formed in an ESD protection circuit as another example.

In the third embodiment, as shown in FIG. 14, the resistance element ER of the ESD protection circuit 52 and the resistance element IR of the internal circuit 51 lie over element isolating trenches 2. In addition, plural dummy active regions 21 are formed in an island or lattice or matrix pattern in element isolating trenches 2 under the resistance elements ER and IR. This means that the surface of the substrate 1 can be flatter than when resistance elements ER and IR are formed over element isolating trenches 2 in which a silicon oxide film is buried.

In this case, in order to reduce the coupling capacitance between the dummy active regions 21 and the resistance elements ER and IR, a thick insulating film (gate insulating film 7) is formed under each of the resistance elements ER and IR. Also in order to prevent deterioration in the ESD immunity of the resistance element ER, no dummy active regions 21 exist under the edges of the resistance element ER.

The invention made by the present inventors has been so far explained in reference to preferred embodiments thereof. However, the invention is not limited thereto and it is obvious that it may be embodied in other various forms without departing from the spirit and scope thereof.

While in the first embodiment the first polycrystal silicon film (n-type polycrystal silicon film used for the high voltage MISFET gate electrode 8) is used to form resistance elements ER and IR, the second polycrystal silicon film (n-type polycrystal silicon film used for the medium voltage p-channel MISFET gate electrode 13 and low voltage p-channel MISFET gate electrode 14) may be used to form resistance elements ER and IR. It is also possible to use the first polycrystal silicon film to form one of the resistance elements ER and IR and use the second polycrystal silicon film to form the other resistance element.

The abovementioned embodiments have been explained on the assumption that the invention is applied to an LCD driver. However the invention is not limited thereto but may be widely applied to other various semiconductor devices in which a high voltage MISFET with a thick gate insulating film and a resistance element as a silicon film are formed over a semiconductor substrate.

The invention is intended to be used for a semiconductor device in which a high voltage MISFET and a resistance element are formed over a semiconductor substrate.

What is claimed is:

1. A semiconductor device comprising:
    a semiconductor substrate having active regions of a silicon layer and an element isolating trench arrangement with a first insulating film buried therein, in a main surface of said semiconductor substrate, each active region being surrounded by a corresponding first portion of said isolating trench arrangement in a plan view such that said active regions are isolated from one another;
    MISFETs formed on predetermined ones of said active regions, each of said MISFETs having a gate insulating film, a gate electrode including a silicon film on said gate insulating film, and source and drain regions at both sides of said gate electrode;
    a resistance element of a silicon film formed over a second portion of said element isolating trench arrangement; and
    a second insulating film formed over said second portion of said element isolating trench arrangement;
    wherein said silicon film of said resistance element and said silicon films of said gate electrodes of said MISFETs are formed as parts of the same silicon layer,
    wherein said second insulating film is formed between a portion of said first insulating film and said silicon film of said resistance element,
    wherein said MISFETs include a first MISFET having a first gate insulating film and operating at a first supply voltage, and a second MISFET having a second gate insulating film thicker than said first gate insulating film and operating at a second supply voltage higher than said first supply voltage, and
    wherein said second insulating film is formed as part of the same insulating layer as said second gate insulating film.

2. A semiconductor device according to claim 1, further comprising an I/O terminal, an internal circuit and an electrostatic discharge protection circuit electrically connected between said I/O terminal and said internal circuit,
    wherein internal circuit includes said first and second MISFETs, and wherein said electrostatic discharge protection circuit includes said resistance element.

3. A semiconductor device according to claim 1, wherein said second insulating film is a silicon oxide film formed by chemical vapor deposition.

4. A semiconductor device comprising:
    a semiconductor substrate having active regions of a silicon layer and an element isolating trench arrangement with a first insulating film buried therein, in a main surface of said semiconductor substrate, each active region being surrounded by a corresponding first portion of said isolating trench arrangement in a plan view such that said active regions are isolated from one another;
    MISFETs formed on predetermined ones of said active regions;
    a plurality of resistance elements of silicon film each formed over a corresponding second portion of said element isolating trench arrangement; and
    wherein each resistance element is disposed over a portion of a second insulating film formed over a portion of said first insulating film in the corresponding second portion of said element isolating trench arrangement,
    wherein an entire area of each resistance element is disposed within an area of the corresponding second portion of said element isolating trench arrangement in said plan view,
    wherein said MISFETs include a first MISFET having a first gate insulating film and operating at a first supply voltage, and a second MISFET having a second gate insulating film thicker than said first gate insulating film and operating at a second supply voltage higher than said first supply voltage, and
    wherein said second insulating film is formed as part of the same insulating layer as said second gate insulating film.

5. A semiconductor device according to claim 4, wherein said first MISFET includes a gate electrode having a silicon film formed on said first gate insulating film,
    said second MISFET includes a gate electrode having a silicon film formed on said second gate insulating film, and wherein
    said silicon films of said resistance elements and said silicon films of said gate electrodes of said first and second MISFETs are formed as parts of the same silicon layer.

6. A semiconductor device according to claim 5, further comprising an I/O terminal, an internal circuit and an electrostatic discharge protection circuit electrically connected between said I/O terminal and said internal circuit,
    wherein said internal circuit includes said first and second MISFETs, and wherein said electrostatic discharge protection circuit includes said plurality of resistance elements.

7. A semiconductor device according to claim 5, wherein said second insulating film is a silicon oxide film formed by chemical vapor deposition.

8. A semiconductor device comprising:
    a semiconductor substrate having active regions of a silicon layer and an element isolating trench arrangement with a first insulating film buried therein, in a main surface of said semiconductor substrate, each active region being surrounded, in a plan view, by a corresponding first portion of said isolating trench arrangement as an inactive region, such that said active regions are isolated from one another;

MISFETs formed on predetermined ones of said active regions; and a plurality of resistance elements of silicon film each formed over a corresponding second portion of said element isolating trench arrangement, wherein each resistance element is disposed over a portion of a second insulating film formed over a portion of said first insulating film in the corresponding second portion of said element isolating trench arrangement, wherein an entire area of each resistance element is disposed within an area of the corresponding second portion of said element isolating trench arrangement in said plan view, wherein each said second insulating film portion is separated from the other second insulating film portions, wherein said MISFETs include a first MISFET having a first gate insulating film and operating at a first supply voltage, and a second MISFET having a second gate insulating film thicker than said first gate insulating film and operating at a second supply voltage higher than said first supply voltage, and wherein said second insulating film is formed as part of the same insulating layer as said second gate insulating film.

9. A semiconductor device according to claim 8, wherein said second insulating film is a silicon oxide film formed by chemical vapor deposition.

* * * * *